(12) United States Patent
Zhang et al.

(10) Patent No.: US 12,314,636 B2
(45) Date of Patent: May 27, 2025

(54) THREE-DIMENSIONAL LOADING STRUCTURE OF ULTRA-LARGE PHYSICAL SIMULATION FACILITY FOR DEEP ENGINEERING DISASTERS

(71) Applicant: Northeastern University, Shenyang (CN)

(72) Inventors: Xiwei Zhang, Shenyang (CN); Xiating Feng, Shenyang (CN); Chunyuan Xue, Shenyang (CN); Lei Shi, Shenyang (CN)

(73) Assignee: NORTHEASTERN UNIVERSITY, Shenyang (CN)

( * ) Notice: Subject to any disclaimer, the term of this patent is extended or adjusted under 35 U.S.C. 154(b) by 0 days.

(21) Appl. No.: 18/031,457

(22) PCT Filed: Feb. 8, 2023

(86) PCT No.: PCT/CN2023/074891
§ 371 (c)(1),
(2) Date: Apr. 12, 2023

(87) PCT Pub. No.: WO2024/152389
PCT Pub. Date: Jul. 25, 2024

(65) Prior Publication Data
US 2025/0086333 A1    Mar. 13, 2025

(30) Foreign Application Priority Data
Jan. 19, 2023    (CN) .......................... 202310058789.5

(51) Int. Cl.
*G01M 99/00*    (2011.01)
*F15B 1/04*    (2006.01)
(Continued)

(52) U.S. Cl.
CPC ................ *G06F 30/13* (2020.01); *F15B 1/04* (2013.01); *F15B 15/1428* (2013.01); *G01M 99/007* (2013.01)

(58) Field of Classification Search
CPC ....... F15B 1/04; F15B 15/1428; G01M 99/00; G01M 99/007; G06F 30/13
See application file for complete search history.

(56) References Cited

U.S. PATENT DOCUMENTS

2017/0248118 A1* 8/2017 Ivers ..................... F03D 1/0625
2019/0242228 A1* 8/2019 Feng ....................... F04B 51/00
(Continued)

FOREIGN PATENT DOCUMENTS

CN    102175533 A    9/2011
CN    108375508 A    8/2018
(Continued)

*Primary Examiner* — Eric S. McCall
(74) *Attorney, Agent, or Firm* — MUNCY, GEISSLER, OLDS & LOWE, P.C.

(57) ABSTRACT

Provided is a three-dimensional loading structure of an ultra-large physical simulation facility for deep engineering disasters. The three-dimensional loading structure comprises a horizontal ultra-large reaction frame, a vertical ultra-large reaction frame, ultra-long stroke lifting and locking hydraulic cylinders, five array distributed hydraulic actuator groups and a linear distributed hydraulic actuator group, wherein the horizontal ultra-large reaction frame adopts a frame structure being formed by splicing eight segments of arch beams, circular in an outer part and square in an inner part, and wrapped with prestressed carbon fibers, and the vertical ultra-large reaction frame adopts a double-beam four-column preload frame structure; the five array distributed hydraulic actuator groups are distributed around the horizontal ultra-large reaction frame and at a top of the vertical ultra-large reaction frame, and the linear distributed hydrau-
(Continued)

lic actuator group is located at a center of a bottom of the vertical ultra-large reaction frame.

10 Claims, 6 Drawing Sheets

(51) Int. Cl.
*F15B 15/14* (2006.01)
*G06F 30/13* (2020.01)

(56) References Cited

U.S. PATENT DOCUMENTS

| | | | |
|---|---|---|---|
| 2022/0196527 A1 | 6/2022 | Zhang et al. | |
| 2022/0412855 A1* | 12/2022 | Feng | G01N 3/12 |
| 2024/0230495 A1* | 7/2024 | Feng | G01N 3/08 |
| 2024/0319047 A1* | 9/2024 | Feng | G06F 30/20 |
| 2025/0067644 A1* | 2/2025 | Liu | G01N 3/08 |

FOREIGN PATENT DOCUMENTS

| | | | |
|---|---|---|---|
| CN | 108375665 A | 8/2018 | |
| CN | 115372152 A | 11/2022 | |
| CN | 116413138 A | 7/2023 | |

\* cited by examiner

THREE-DIMENSIONAL LOADING STRUCTURE OF ULTRA-LARGE PHYSICAL SIMULATION FACILITY FOR DEEP ENGINEERING DISASTERS

BACKGROUND OF THE INVENTION

1. Field of the Invention

The invention relates to the technical field of rock mechanics test, and particularly relates to a three-dimensional loading structure of an ultra-large physical simulation facility for deep engineering disasters.

2. The Prior Arts

At present, in view of insecurity of the implementation of in-situ test monitoring and high operation difficulty, in order to realize simulation and monitoring of the incubation process of deep engineering disasters, it is usually a solution based on a similarity theory to use three-dimensional physical model test equipment of similar materials to perform relevant tests, a physical model sample similar to engineering rock masses is scaled down, and boundary stress is applied to the physical model sample through a three-dimensional loading structure.

The three-dimensional loading structure is used as a basic platform for performing physical model tests of the similar materials, and the loading stability and reliability of the three-dimensional loading structure directly affect the credibility of simulation results. At present, the similarity ratio of a model sample of the existing three-dimensional physical model test equipment of the similar materials is too large, which leads to distortion of geological structure information and cannot effectively reproduce the complexity of deep engineering; and at the same time, the ability of engineering behavior simulation and online monitoring is limited, and there are the following problems to be solved urgently.

(1) The design of a three-dimensional reaction metal frame structure needs to be broken through. The rigidity of the existing three-dimensional loading frame is generally low, and therefore, using the frame with the tensile capacity, the deep ground stress condition of the large-size sample cannot be simulated; and the frame generally adopts a steel structure welding process or a structural part bolt connection process, which is only applicable to a three-dimensional physical model test machine with low rigidity requirements and a total output load of 1000 tons. In order to realize simulation of complex stress environment of rocks being 10000 m deep underground, it is necessary to design a manufacturing process for an ultra-large-size high-rigidity three-dimensional loading reaction frame structure and an ultra-large-size loading frame to realize high rigidity and high-ultimate tensile capacity of the ultra-large loading frame.

(2) An ultra-large-area ultra-large load technology for the three-dimensional physical model of the similar materials needs to be broken through. Usually, the existing model test system is only applicable to small-size samples being 2 m or below, has main capacity of plane loading, static loading, and uniform loading, but cannot achieve true three-dimensional gradient loading capacity, local area load capacity, line load capacity, and local tectonic stress loading capacity. Most of the existing model test systems adopt load loading technologies such as large-tonnage hydraulic actuators or hydraulic sleepers, which can only meet uniform stress of 2-3 MPa. In order to simulate a complex excavation/mining process of deep engineering, it is necessary to design a precise stress application technology of low-friction array hydraulic servo actuators matching with ultra-large area and ultra-large load, so that effective and accurate transfer of boundary stress of the physical model sample to a specific position inside the sample is realized, and a fracture position is consistent with a theoretical analytical solution and an actual engineering excavation position.

(3) A surface-to-surface (left-surface-to-right-surface, front-surface-to-right-surface, top-surface-to-bottom-surface) centering loading technology for the three-dimensional physical model of the similar materials needs to be break through. The existing model test system cannot maintain centering when the sample is damaged and the disasters occur, especially when dynamic load disasters taking rockbursts as a typical example occur, it is a technical difficulty for samples to perform synchronous centering loading and load holding for more than 5000 hours. In most of the existing technologies, an actuator is used to load one end surface, and for the other end surface, a steel plate is used as a passive reaction balance end surface. The loading technology can be used in one-dimensional loading, but during three-dimensional loading, high end surface friction and asymmetric deformation can be generated, thereby resulting in disaster-causing conditions inconsistent with the disasters induced by deep engineering excavation, and a disaster mechanism it is difficult to deduce. In order to achieve breakthrough in the centering loading technology, it is necessary to make the position of the loading frame adjust synchronously with the compression deformation of the sample to ensure that the geometric center of the sample remains unchanged.

(4) The simulation technology of complex chamber/stope group excavation behaviors under the condition of stable and controllable high three-dimensional boundary load needs to be broken through. In most of the existing technologies, a method of simulating engineering objects with prefabricated holes first and then loading is adopted, which leads to failure to truly simulate engineering behaviors under high stress conditions of deep engineering, and failure to realize simulation of engineering disasters under the combined action of tectonic stress and excavation in deep engineering. In order to realize the excavation behavior simulation of complex chambers/stope groups under the condition of stable and controllable high three-dimensional boundary load, it is necessary to reserve excavation channels and working space on the ultra-large physical model sample and design a balanced pressure excavation technology to ensure stable and controllable high three-dimensional boundary load.

(5) A precise mounting and disassembly technology of an oversized and overweight three-dimensional physical model sample needs to be broken through. In the existing model test system, mostly, samples are manufactured by stacking, pouring, vibrating and other methods in situ on a three-dimensional physical model test machine, and a method of accurately manufacturing a three-dimensional physical model sample with a complex geological structure and other characteristics in different places is seldom adopted. In order to realize precise mounting and disassembly of the oversized and overweight three-dimensional physical model sample, it is necessary to realize mounting and disassembly of the sample without damaging the quality of the sample.

SUMMARY OF THE INVENTION

In view of the problems existing in the existing technology, the invention provides a three-dimensional loading structure of an ultra-large physical simulation facility for deep engineering disasters. The three-dimensional loading structure has high rigidity and high ultimate tensile capacity of an ultra-large loading frame, has precise stress application capacity of an ultra-large-area ultra-large load, has surface-to-surface centering loading capacity of a three-dimensional physical model of similar materials, has independent loading capacity, synchronous loading capacity, symmetric loading capacity, local dynamic disturbance loading capacity, stress gradient loading capacity and asymmetric stress loading capacity of true-triaxial stress, and can truly simulate deep typical geological disasters jointly induced by tectonic stress, disturbance stress, various engineering activities, and the like.

In order to realize the above purposes, the present invention provides a three-dimensional loading structure of an ultra-large physical simulation facility for deep engineering disasters comprising: a horizontal ultra-large reaction frame, a vertical ultra-large reaction frame, a first array distributed hydraulic actuator group, a second array distributed hydraulic actuator group, a third array distributed hydraulic actuator group, a fourth array distributed hydraulic actuator group, a fifth array distributed hydraulic actuator group, a linear distributed hydraulic actuator group and an ultra-long stroke lifting and locking hydraulic cylinder, wherein the vertical ultra-large reaction frame comprises a reaction top plate, support columns and a reaction base; the horizontal ultra-large reaction frame adopts a circular structure being circular in an outer part and square in an inner part; the horizontal ultra-large reaction frame is fixedly mounted in a large concrete foundation pit mounting slot, and an upper surface of the horizontal ultra-large reaction frame is flush with a ground; the vertical ultra-large reaction frame is located inside the horizontal ultra-large reaction frame; the reaction base is located directly below the reaction top plate, and the reaction base and the reaction top plate are fixedly connected by the four uniformly-distributed support columns; the support columns adopt a hollow structure, a pre-stressed pull rod is mounted in each support column in a penetrating manner, and the reaction top plate, the support columns and the reaction base are firmly connected by the pre-stressed pull rods and through pre-stress forces provided by high-strength nuts; the four ultra-long stroke lifting and locking hydraulic cylinders are uniformly arranged between the horizontal ultra-large reaction frame and the reaction top plate; a cylinder barrel of each ultra-long stroke lifting and locking hydraulic cylinder is embedded and fixed in the horizontal ultra-large reaction frame, and a piston rod of each ultra-long stroke lifting and locking hydraulic cylinder is upwards to be fixedly connected with the reaction top plate; the first array distributed hydraulic actuator group is arranged on a lower surface of the reaction top plate; the second array distributed hydraulic actuator group, the third array distributed hydraulic actuator group, the fourth array distributed hydraulic actuator group and the fifth array distributed hydraulic actuator group are respectively arranged on an inner square surface of the horizontal ultra-large reaction frame, the second array distributed hydraulic actuator group and the fourth array distributed hydraulic actuator group are distributed in opposite directions, and the third array distributed hydraulic actuator group and the fifth array distributed hydraulic actuator group are distributed in opposite directions; and the linear distributed hydraulic actuator group is embedded at a middle of an upper surface of the reaction base, and a loading surface of the linear distributed hydraulic actuator group is flush with the upper surface of the reaction base.

The horizontal ultra-large reaction frame is formed by splicing eight segments of arch beams, an outer circumference surface of the horizontal ultra-large reaction frame is wrapped with prestressed carbon fibers, and a winding preload of the prestressed carbon fibers is not less than 1.5 times of a working load of the horizontal ultra-large reaction frame.

Single hydraulic actuators at centers of the first array distributed hydraulic actuator group, the second array distributed hydraulic actuator group, the third array distributed hydraulic actuator group, the fourth array distributed hydraulic actuator group and the fifth array distributed hydraulic actuator group all adopt through-type hydraulic actuators, and a piston rod of each through-type hydraulic actuator adopts a double-output rod hollow structure.

Four excavation channels are uniformly distributed on a circumference of the horizontal ultra-large reaction frame, and the four excavation channels and the through-type hydraulic actuators at the centers of the second array distributed hydraulic actuator group, the third array distributed hydraulic actuator group, the fourth array distributed hydraulic actuator group and the fifth array distributed hydraulic actuator group are coaxially distributed.

Drilling channels are formed in a center of the reaction top plate, and the drilling channels and the through-type hydraulic actuator at the center of the first array distributed hydraulic actuator group are coaxially distributed.

The ultra-long stroke lifting and locking hydraulic cylinders are also used as follow-up centering hydraulic actuators of the vertical ultra-large reaction frame; a friction-reducing sliding sleeve is arranged between the support columns and the horizontal ultra-large reaction frame; and each ultra-long stroke lifting and locking hydraulic cylinder is provided with an energy accumulator and an electronic pressure valve, and the electronic pressure valves are used to dynamically adjust a pressure in the energy accumulators, so that the pressure in the energy accumulators and a self-gravity of the vertical ultra-large reaction frame always maintain a dynamic balance.

A sample transferring mechanism is arranged on a side ground of the large concrete foundation pit mounting slot where the horizontal ultra-large reaction frame is located; the sample transferring mechanism comprises a RGV (Rail Guided Vehicle) rail flat car, flat car guide rails, a sample bearing sliding table, sliding table guide rails, sliding table lifting oil cylinders and sliding table push and pull devices; the flat car guide rails are fixedly laid on the ground, the RGV rail flat car is arranged on the flat car guide rails, and an upper surface of the RGV rail flat car is flush with the upper surface of the horizontal ultra-large reaction frame; the sample bearing sliding table is placed on the upper surface of the RGV rail flat car, four grooves are uniformly formed in a lower surface of the sample bearing sliding table, one sliding table lifting oil cylinder is vertically mounted in each groove, and when piston rods of the sliding table lifting oil cylinders are fully retracted, the sliding table lifting oil cylinders are completely hidden in the grooves; the sliding table guide rails adopt a temporary laying structure, and when the sliding table guide rails are temporarily laid between the upper surface of the RGV rail flat car and the upper surface of the horizontal ultra-large reaction frame, the sample bearing sliding table is used in conjunction with the sliding table guide rails; and the sliding table push and pull devices are arranged between the sample bearing sliding table and the ground.

All single hydraulic actuators contained in the linear distributed hydraulic actuator group are dynamic hydraulic actuators, and a maximum disturbance frequency of each dynamic hydraulic actuator is 5 Hz; an external bracket of each dynamic hydraulic actuator comprises four guide rods resisting lateral forces; and each dynamic hydraulic actuator adopts a double-output rod symmetrical structure, a large-flow integrated valve block is arranged outside a cylinder barrel of each dynamic hydraulic actuator, and each large-flow integrated valve block is provided with double servo valves.

Structures of the single hydraulic actuators contained in the first array distributed hydraulic actuator group, the second array distributed hydraulic actuator group, the third array distributed hydraulic actuator group, the fourth array distributed hydraulic actuator group and the fifth array distributed hydraulic actuator group are the same, a magnetostrictive displacement sensor is arranged between a piston inside a cylinder barrel and a bottom plate of the cylinder barrel of each single hydraulic actuator, a servo valve and an energy accumulator are arranged outside the cylinder barrel of each single hydraulic actuator, and a load sensor is arranged at a piston end of each single hydraulic actuator.

A cluster large-flow high-pressure hydraulic pump station is arranged under the side ground of the large concrete foundation pit mounting slot where the horizontal ultra-large reaction frame is located, a hydraulic oil source system is arranged in the cluster large-flow high-pressure hydraulic pump station, adopts a distributed hydraulic station design scheme, and comprises eight hydraulic stations in total, wherein first five hydraulic stations are respectively connected with the first array distributed hydraulic actuator group, the second array distributed hydraulic actuator group, the third array distributed hydraulic actuator group, the fourth array distributed hydraulic actuator group and the fifth array distributed hydraulic actuator group, a sixth hydraulic station is connected with the linear distributed hydraulic actuator group, a seventh hydraulic station is connected with the ultra-long stroke lifting and locking hydraulic cylinders, and an eighth hydraulic station serves as a standby hydraulic station.

The present invention has the beneficial effects:

1. High rigidity and high ultimate tensile capacity of the ultra-large loading frame can be realized.

The horizontal ultra-large reaction frame disclosed by the invention adopts a structure being circular in outer part and square in inner part, and is formed by splicing eight segments of arch beams, the outer circle surface is wrapped with prestressed carbon fibers, and the vertical ultra-large reaction frame adopts a double-beam four-column preload frame structure. The reaction frame structure effectively solves the problem of being insufficient in rigidity and ultimate tensile capacity of the ultra-large loading frame, a physical similarity model of 5-meter scale of dynamic disturbance under the condition of true-triaxial stress can be simulated, the true-triaxial stress of 6 MPa can be provided for the ultra-large physical model sample, and stable stress load holding time can reach 5000 h. Simulation of the stress environment of rocks being maximum 10000 m deep underground within the range of stress similarity ratio of (1:40) to (1:100), and simulation of the stress environment of rocks with engineering scope similarity ratio of 50000-12550000 m³ can be realized.

2. The ultra-large-area a ultra-large-load loading capacity of the three-dimensional physical model of similar materials can be realized.

Based on the three-dimensional boundary stress loading, the invention can realize independent loading, synchronous loading, symmetric loading, local dynamic disturbance loading, stress gradient loading and asymmetric stress loading of true-triaxial stress, and realize simulation of tectonic stress in the deep engineering environment.

3. The surface-to-surface (left-surface-to-right-surface, front-surface-to-rear-surface, top-surface-to-bottom-surface) centering loading capacity of the three-dimensional physical model of the similar materials can be realized.

Based on a follow-up centering technology of the vertical frame of a balance hydraulic cylinder, centering loading in the vertical direction is realized, the dead weight of the vertical ultra-large reaction frame is also reduced, further centering holding is realized when the model is damaged and disasters occur, and especially when the dynamic load disasters such as rockbursts occur, the centering loading of the sample and load holding and centering for a long time exceeding 5000 hours can be realized.

4. The stability control capability of excavation interface load of complex chamber group can be realized.

Through oppositely-arranged balance pressure through-type hydraulic actuator groups, a load stability control technology of a complex chamber group excavation interface is realized, and simulation of engineering activities such as deep stope excavation, deep tunnel excavation, and deep oil and gas drilling of the ultra-large physical model sample under three-dimensional stress environment is realized.

5. Precise mounting and disassembly capacity of oversized and overweight model samples can be realized.

The sample transferring mechanism consisting of the RGV rail flat car, the flat car guide rails, the sample bearing sliding table, the sliding table guide rails, the sliding table lifting oil cylinders and the sliding table push and pull devices can realize accurate mounting and disassembly of oversized and overweight model samples without damaging the samples.

In drawings, 1: horizontal ultra-large reaction frame, 2: first array distributed hydraulic actuator group, 3: second array distributed hydraulic actuator group, 4: third array distributed hydraulic actuator group, 5: fourth array distributed hydraulic actuator group, 6: fifth array distributed hydraulic actuator group, 7: linear distributed hydraulic actuator group, 8: ultra-long stroke lifting and locking hydraulic cylinder, 9: reaction top plate, 10: support column, 11: reaction base, 12: prestressed carbon fiber, 13: through-type hydraulic actuator, 14: excavation channel, 15: drilling channel, 16: RGV rail flat car, 17: flat car guide rail, 18: sample bearing sliding table, 19: sliding table guide rail, 20: sliding table push and pull device, and 21: ultra-large physical model sample.

DETAILED DESCRIPTION OF THE PREFERRED EMBODIMENT

The invention will be further described in detail with reference to the attached drawings and specific embodiments.

As shown in FIGS. 1-6, a three-dimensional loading structure of an ultra-large physical simulation facility for deep engineering disasters comprises a horizontal ultra-large reaction frame 1, a vertical ultra-large reaction frame, a first array distributed hydraulic actuator group 2, a second array distributed hydraulic actuator group 3, a third array distributed hydraulic actuator group 4, a fourth array distributed hydraulic actuator group 5, a fifth array distributed hydraulic actuator group 6, a linear distributed hydraulic actuator group 7 and ultra-long stroke lifting and locking hydraulic cylinders 8, wherein the vertical ultra-large reaction frame comprises a reaction top plate 9, support columns 10 and a reaction base 11; the horizontal ultra-large reaction frame 1 adopts a circular structure being circular in an outer part and square in an inner part; the horizontal ultra-large reaction frame 1 is fixedly mounted in a large concrete foundation pit mounting slot, and an upper surface of the horizontal ultra-large reaction frame 1 is flush with a ground; in the embodiment, a diameter of an outer circle of the horizontal ultra-large reaction frame 1 is 20 m, an inner square side length is 10 m, and a vertical height is 5.5 m; the vertical ultra-large reaction frame is located inside the horizontal ultra-large reaction frame 1; the reaction base 11 is located directly below the reaction top plate 9, and the reaction base 11 and the reaction top plate 9 are fixedly connected by the four uniformly-distributed support columns 10; in the embodiment, a distance between the reaction base 11 and the reaction top plate 9 is 8.5 m; the support columns 10 adopt a hollow structure, a pre-stressed pull rod is mounted in each support column 10 in a penetrating manner, and the reaction top plate 9, the support columns 10 and the reaction base 11 are firmly connected by the pre-stressed pull rods and through pre-stress forces provided by high-strength nuts; and in the embodiment, the reaction base 11 adopts a split casting composite structure, which can bear 300 t of samples and ensure to provide 15000 t of static reaction support vertically. In addition, in order to meet the reliability of the entire vertical ultra-large reaction frame when the actuators are loaded to a limit and an output is 15000 t, reduce impact of tensile deformation of the frame on a test, and improve the stability of the whole frame, the pre-stressed pull rods inside the support columns 10 should need to be in a tensile stress state, so that the support columns 10 need to always be in a yield stress state; the four ultra-long stroke lifting and locking hydraulic cylinders 8 are uniformly arranged between the horizontal ultra-large reaction frame 1 and the reaction top plate 9; a cylinder barrel of each ultra-long stroke lifting and locking hydraulic cylinder 8 is embedded and fixed in the horizontal ultra-large reaction frame 1, and a piston rod of each ultra-long stroke lifting and locking hydraulic cylinder 8 is upwards to be fixedly connected with the reaction top plate 9; the first array distributed hydraulic actuator group 2 is arranged on a lower surface of the reaction top plate 9; the second array distributed hydraulic actuator group 3, the third array distributed hydraulic actuator group 4, the fourth array distributed hydraulic actuator group 5 and the fifth array distributed hydraulic actuator group 6 are respectively arranged on an inner square surface of the horizontal ultra-large reaction frame 1, the second array distributed hydraulic actuator group 3 and the fourth array distributed hydraulic actuator group 5 are distributed in opposite directions, and the third array distributed hydraulic actuator group 4 and the fifth array distributed hydraulic actuator group 6 are distributed in opposite directions; the linear distributed hydraulic actuator group 7 is embedded at a middle of an upper surface of the reaction base 11, and a loading surface of the linear distributed hydraulic actuator group 7 is flush with the upper surface of the reaction base 11; in the embodiment, the first array distributed hydraulic actuator group 2, the second array distributed hydraulic actuator group 3, the third array distributed hydraulic actuator group 4, the fourth array distributed hydraulic actuator group 5 and the fifth array distributed hydraulic actuator group 6 all contain 25 single hydraulic actuators, and the 25 single hydraulic actuators are distributed in a 5*5 array; and the linear distributed hydraulic actuator group 7 contains 5 single hydraulic actuators, and the 5 single hydraulic actuators are distributed in a straight line.

Figure 5:
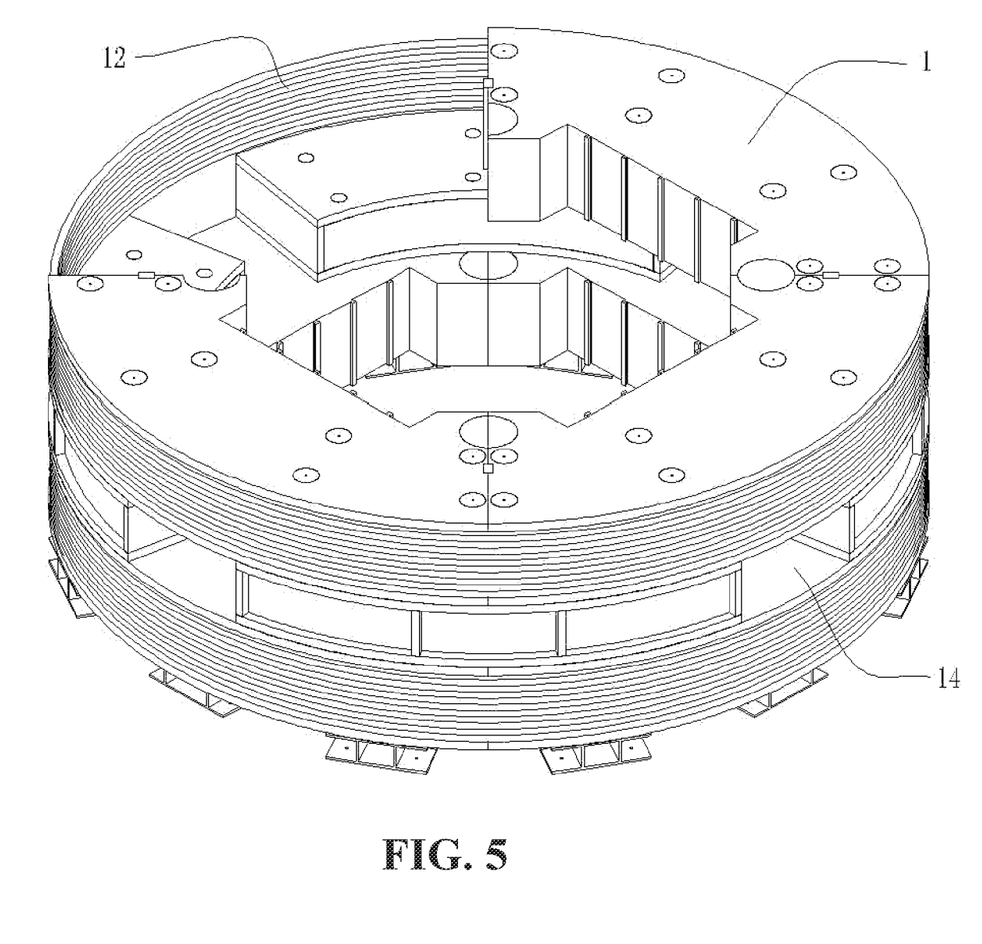
FIG. 5 is a structural schematic view of a horizontal ultra-large reaction frame of the invention.

The horizontal ultra-large reaction frame 1 is formed by splicing eight segments of arch beams, an outer circumference surface of the horizontal ultra-large reaction frame 1 is wrapped with prestressed carbon fibers 12, and a winding preload of the prestressed carbon fibers 12 is not less than 1.5 times of a working load of the horizontal ultra-large reaction frame 1. In the embodiment, the eight segments of arch beams are independently processed by casting. An allowable stress of the prestressed carbon fibers 12 is 800 MPa, and a cross-sectional area of the prestressed carbon fibers 12 is 6×1.5 mm$^2$, an elastic modulus of the prestressed carbon fibers 12 is 209 GPa, and the number of winding layers of the prestressed carbon fibers 12 is 3667.

Figure 4:
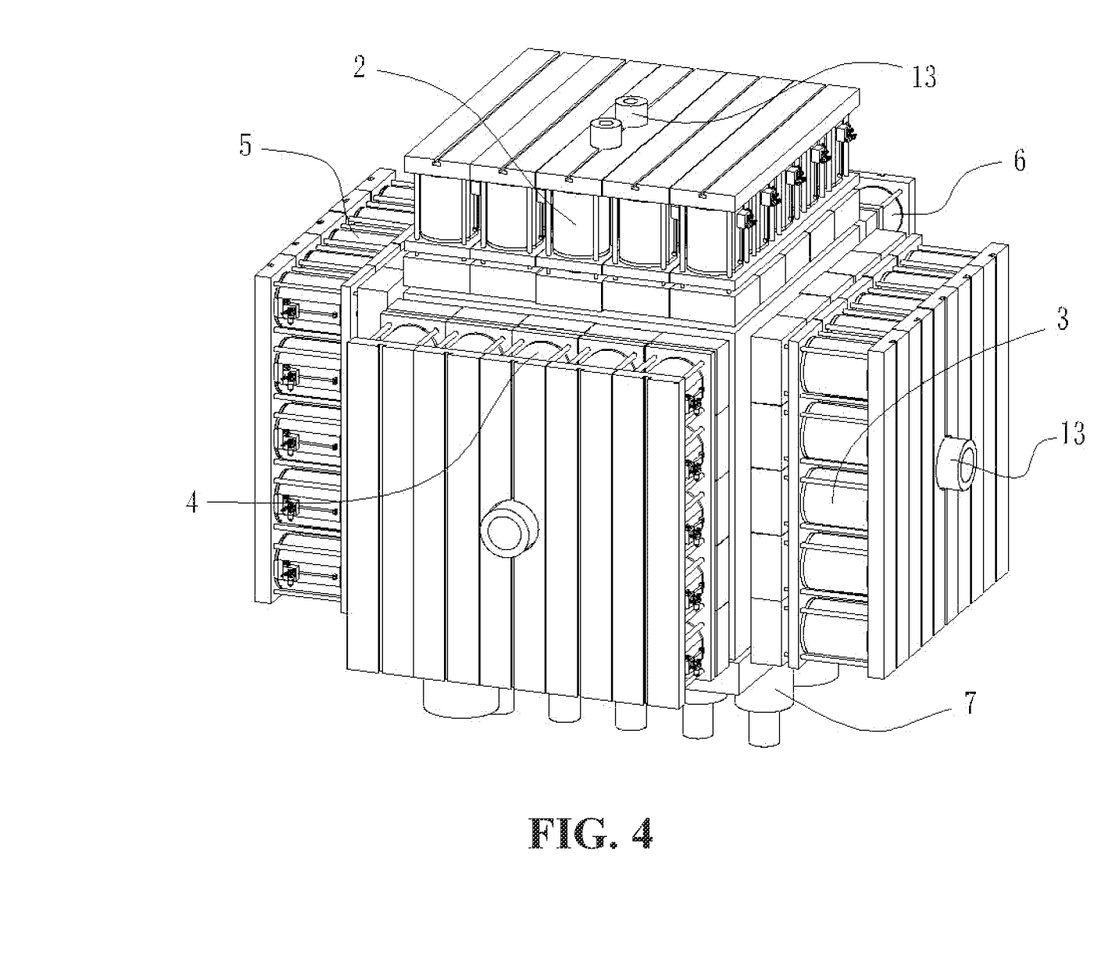
FIG. 4 is a spatial distribution view of the array distributed hydraulic actuator groups and the linear distributed hydraulic actuator groups under the loading state of the invention.

The single hydraulic actuators 13 at centers of the first array distributed hydraulic actuator group 2, the second array distributed hydraulic actuator group 3, the third array distributed hydraulic actuator group 4, the fourth array distributed hydraulic actuator group 5 and the fifth array distributed hydraulic actuator group 6 all adopt through-type hydraulic actuators 13, and a piston rod of each through-type hydraulic actuator 13 adopts the double-output rod hollow structure. In the embodiment, a hollow diameter of the piston rod of the through-type hydraulic actuator 13 at the center of the first array distributed hydraulic actuator group 2 is 300 mm, and a hollow diameter of each piston rod of the through-type hydraulic actuators 13 at the centers of the second array distributed hydraulic actuator group 3, the third array distributed hydraulic actuator group 4, the fourth array distributed hydraulic actuator group 5 and the fifth array distributed hydraulic actuator group is 500 mm.

Four excavation channels 14 are uniformly distributed on a circumference of the horizontal ultra-large reaction frame 1, and the four excavation channels 14 and the through-type hydraulic actuators 13 at the centers of the second array distributed hydraulic actuator group 3, the third array distributed hydraulic actuator group 4, the fourth array distributed hydraulic actuator group 5 and the fifth array distributed hydraulic actuator group 6 are coaxially distributed. In the embodiment, a channel diameter of each of four excavation channels 14 is not less than 500 mm.

Figure 6:
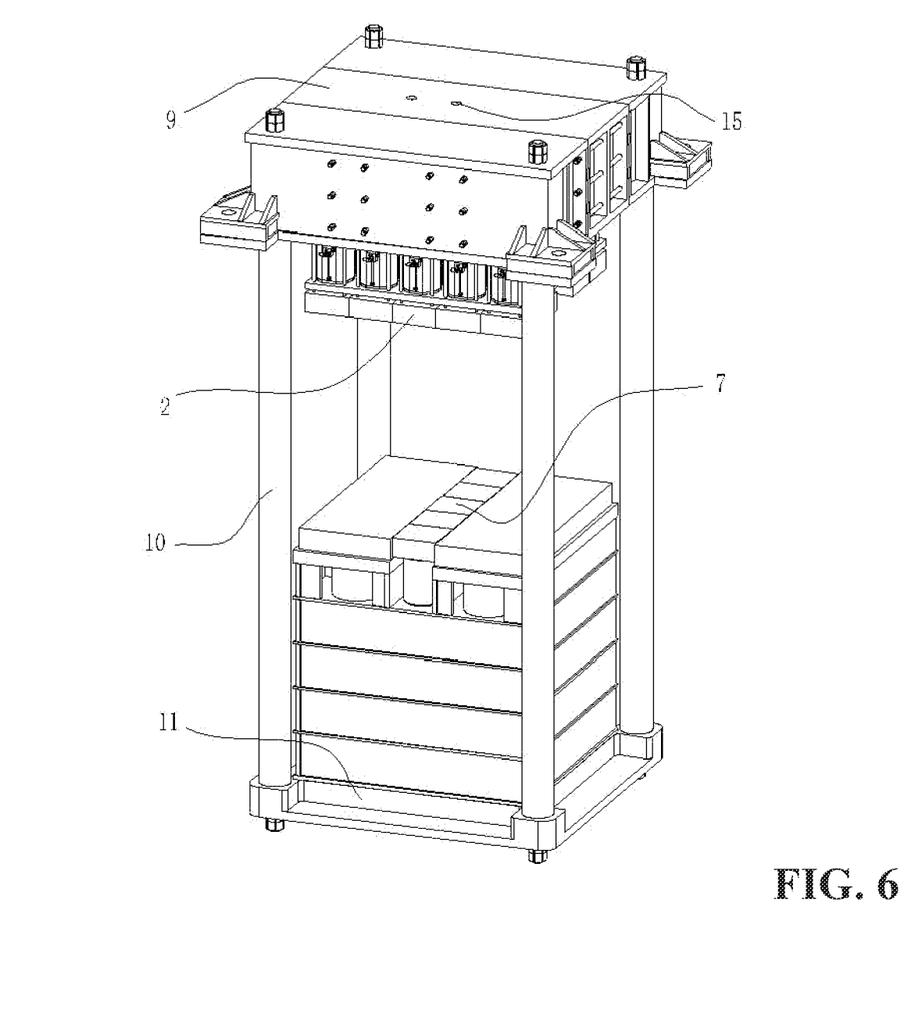
FIG. 6 is a structural schematic view of a vertical ultra-large reaction frame of the invention.

Drilling channels 15 are formed in a center of the reaction top plate 9, and the drilling channels 15 and the through-type hydraulic actuator 13 at the center of the first array distributed hydraulic actuator group 2 are coaxially distributed. In the embodiment, the number of the drilling channels 15 is two, and a channel diameter of the drilling channels 15 is not less than 300 mm.

The ultra-long stroke lifting and locking hydraulic cylinders 8 are also used as follow-up centering hydraulic actuators of the vertical ultra-large reaction frame. In order to ensure vertical floating precision of the vertical ultra-large reaction frame, a friction-reducing sliding sleeve is arranged between the support columns 10 and the horizontal ultra-large reaction frame 1; and each ultra-long stroke lifting and locking hydraulic cylinder 8 is provided with an energy accumulator and an electronic pressure valve, and the electronic pressure valves are used to dynamically adjust the pressure in the energy accumulators, so that a pressure in the energy accumulators and a self-gravity of the vertical ultra-large reaction frame always maintain a dynamic balance.

Figure 1:
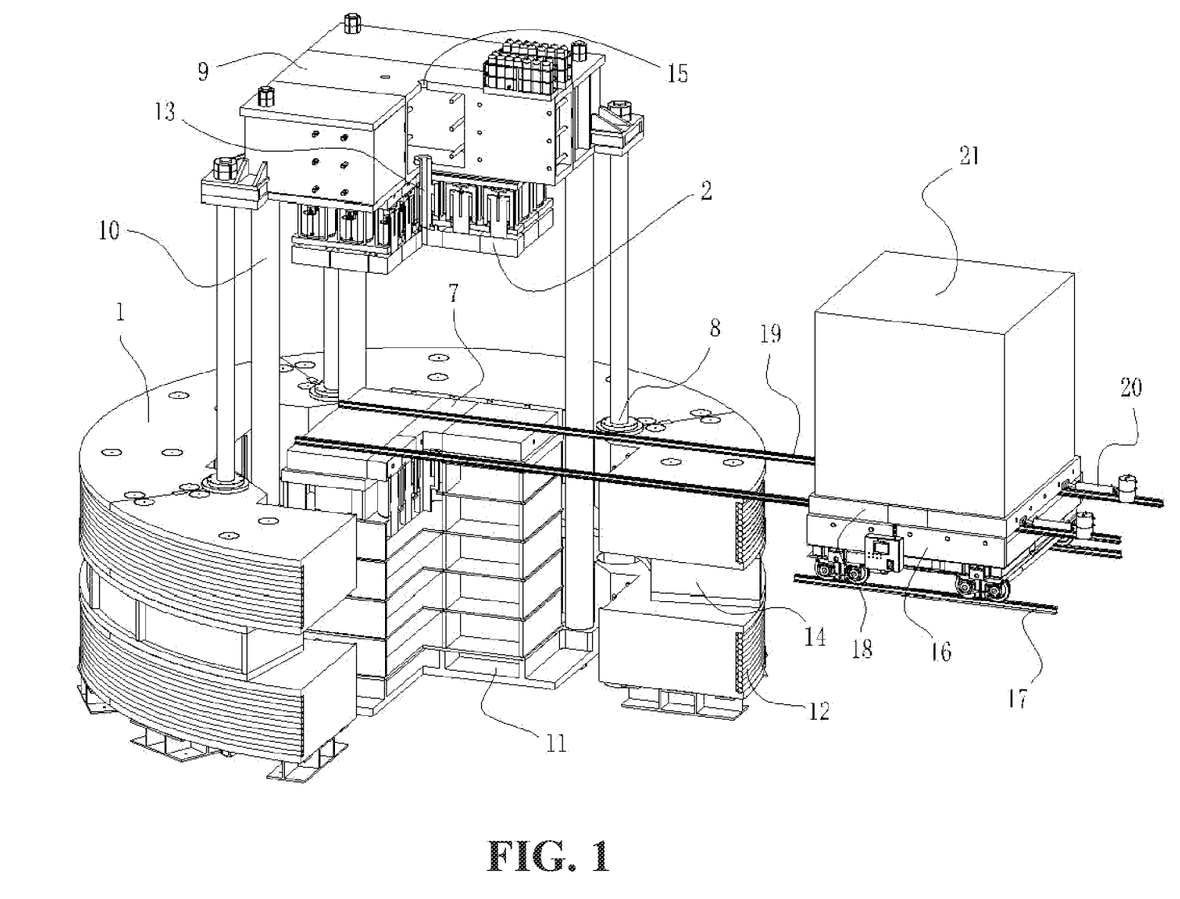
FIG. 1 is a schematic view of a three-dimensional loading structure (the second to fourth array distributed hydraulic actuator groups are not shown) of an ultra-large physical simulation facility for deep engineering disasters of the invention (state I).

A sample transferring mechanism is arranged on a side ground of the large concrete foundation pit mounting slot where the horizontal ultra-large reaction frame 1 is located; the sample transferring mechanism comprises a RGV rail flat car 16, flat car guide rails 17, a sample bearing sliding table 18, sliding table guide rails 19, sliding table lifting oil cylinders and sliding table push and pull devices 20; the flat car guide rails 17 are fixedly laid on the ground, the RGV rail flat car 16 is arranged on the flat car guide rails 17, and an upper surface of the RGV rail flat car 16 is flush with the upper surface of the horizontal ultra-large reaction frame 1; the sample bearing sliding table 18 is placed on the upper surface of the RGV rail flat car 16, four grooves are uniformly formed in a lower surface of the sample bearing sliding table 18, one sliding table lifting oil cylinder is vertically mounted in each groove, and when piston rods of the sliding table lifting oil cylinders are fully retracted, the sliding table lifting oil cylinders are completely hidden in the grooves; the sliding table guide rails 19 adopt a temporary laying structure, and when the sliding table guide rails 19 are temporarily laid between the upper surface of the RGV rail flat car 16 and the upper surface of the horizontal ultra-large reaction frame 1, the sample bearing sliding table 18 is used in conjunction with the sliding table guide rails 19; and the sliding table push and pull devices 20 are arranged between the sample bearing sliding table 18 and the ground.

All single hydraulic actuators contained in the linear distributed hydraulic actuator group 7 are dynamic hydraulic actuators, and a maximum disturbance frequency of each dynamic hydraulic actuator is 5 Hz; an external bracket of each dynamic hydraulic actuator comprises four guide rods resisting lateral forces; and the dynamic hydraulic actuator adopts a double-output rod symmetrical structure, a large-flow integrated valve block is arranged outside a cylinder barrel of each dynamic hydraulic actuator, and each large-flow integrated valve block is provided with double servo valves.

The structures of the single hydraulic actuators contained in the first array distributed hydraulic actuator group 2, the second array distributed hydraulic actuator group 3, the third array distributed hydraulic actuator group 4, the fourth array distributed hydraulic actuator group 5 and the fifth array distributed hydraulic actuator group 6 are the same, a magnetostrictive displacement sensor is arranged between a piston inside a cylinder barrel and a bottom plate of the cylinder barrel of each single hydraulic actuator, a servo valve and an energy accumulator are arranged outside the cylinder barrel of each single hydraulic actuator, and a load sensor is arranged at a piston end of each single hydraulic actuator.

A cluster large-flow high-pressure hydraulic pump station is arranged under the side ground of the large concrete foundation pit mounting slot where the horizontal ultra-large reaction frame 1 is located, a hydraulic oil source system is arranged in the cluster large-flow high-pressure hydraulic pump station, adopts a distributed hydraulic station design scheme, and comprises eight hydraulic stations in total, wherein first five hydraulic stations are respectively connected with the first array distributed hydraulic actuator group 2, the second array distributed hydraulic actuator group 3, the third array distributed hydraulic actuator group 4, the fourth array distributed hydraulic actuator group 5 and the fifth array distributed hydraulic actuator group 6, a sixth hydraulic station is connected with the linear distributed hydraulic actuator group 7, a seventh hydraulic station is connected with the ultra-long stroke lifting and locking hydraulic cylinders 8, and an eighth hydraulic station serves as a standby hydraulic station; and in the embodiment, a maximum flow of the hydraulic station is 4000 L/min, and a rated working pressure of the hydraulic station is 21 MPa. A distributed main control center is also arranged on the ground, and uses full digital controllers. Data acquisition and control software is installed in the distributed main control center, and a closed-loop servo PID redundancy control mode is adopted. For each full digital controller, five control channels form five sets of electro-hydraulic servo systems. Each set of the electro-hydraulic servo system consists of an electro-hydraulic servo valve, a hydraulic actuator, a displacement sensor, a load sensor, and the like, to realize independent load control, displacement control and shock-free conversion control during the test for each hydraulic actuator.

The simulation of fracture rockbursts is taken as an example, when the ultra-large physical simulation facility for deep engineering disasters adopts the three-dimensional loading structure disclosed by the invention, the test is performed through the ultra-large physical simulation facility of deep engineering disasters, comprising the following steps:

Step I: Preparing an Ultra-Large Physical Model Sample.

A 3D printing system for the model sample is used to print and make the ultra-large physical model sample 21 on the sample bearing sliding table 18 of the sample transferring mechanism, wherein a size of the ultra-large physical model sample 21 is 5 m×5 m×5 m, including a structural plane with an inclination of 45 degrees, a length of 3.5 m and a width of 1 m; during the printing process of the ultra-large physical model sample 21, a stress-strain-vibration-acoustic emission-ultrasonic integrated sensor, a fiber grating high-sensitivity fine temperature-pressure-stress integrated monitoring sensor and an acoustic emission sensor are pre-embedded in the ultra-large physical model sample;

Step II: Transferring the Ultra-Large Physical Model Sample.

When the ultra-large physical model sample 21 finishes printing and curing, the RGV rail flat car 16 of the sample transferring mechanism is firstly used to move along the flat car guide rails 17, and then the ultra-large physical model sample 21 moves to a side of the horizontal ultra-large reaction frame 1, and then the piston rods of the four groups of sliding table lifting oil cylinders under the sample bearing sliding table 18 are controlled to extend downward out of the grooves, and under an action of the reverse lifting force of the sliding table lifting oil cylinders, the sample bearing sliding table 18 is lifted from the upper surface of the RGV rail flat car 16; after the sample bearing sliding table 18 is lifted to a predetermined height, the prepared sliding table guide rails 19 pass through a gap between the sample bearing sliding table 18 and the upper surface of the RGV rail flat car 16, the other ends of the sliding table guide rails 19 need to be accurately lapped on the upper surface of the horizontal ultra-large reaction frame 1 and the upper surface of the reaction base 11, and then the piston rods of the sliding table lifting oil cylinders are controlled to retract to an initial position until the sliding table lifting oil cylinders are hidden back into the groove, and at this time, the sample bearing sliding table 18 also falls onto the siding table guide rails 19; after the sample bearing sliding table 18 completely falls onto the sliding table guide rails 19, the siding table push and pull devices 20 are connected with the sample bearing sliding table 18, and then a thrust force is applied to the sample bearing sliding table 18 through the sliding table push and pull devices 20, so that the sample bearing sliding table 18 moves directly above the reaction base 11 along the sliding table guide rails 19; when the sample bearing sliding table 18 moves in place, the sliding table push and pull devices 20 are disconnected with the sample bearing sliding table 18, and then the sample bearing sliding table 18 is lifted again by the sliding table lifting oil cylinders to make the sample bearing sliding table 18 out of contact with the sliding table guide rails 19, then the sliding table guide rails 19 are removed, finally, the sliding table lifting oil cylinders are controlled to retract and hide into the grooves, and finally, the sample bearing sliding table 18 falls onto the upper surface of the reaction base 11, and at this time, a transfer removal of the ultra-large physical model sample 21 is completed; then leads of the stress-strain-vibration-acoustic emission-ultrasonic integrated sensor, the fiber grating high-sensitivity fine temperature-pressure-stress integrated monitoring sensor and the acoustic emission sensor, which are pre-embedded in the ultra-large physical model sample 21, are electrically connected with the distributed main control center, and each sensor is tested before the test to ensure that all sensors can work normally.

Step III: Mounting the Ultra-Large Physical Model Sample.

Figure 2:
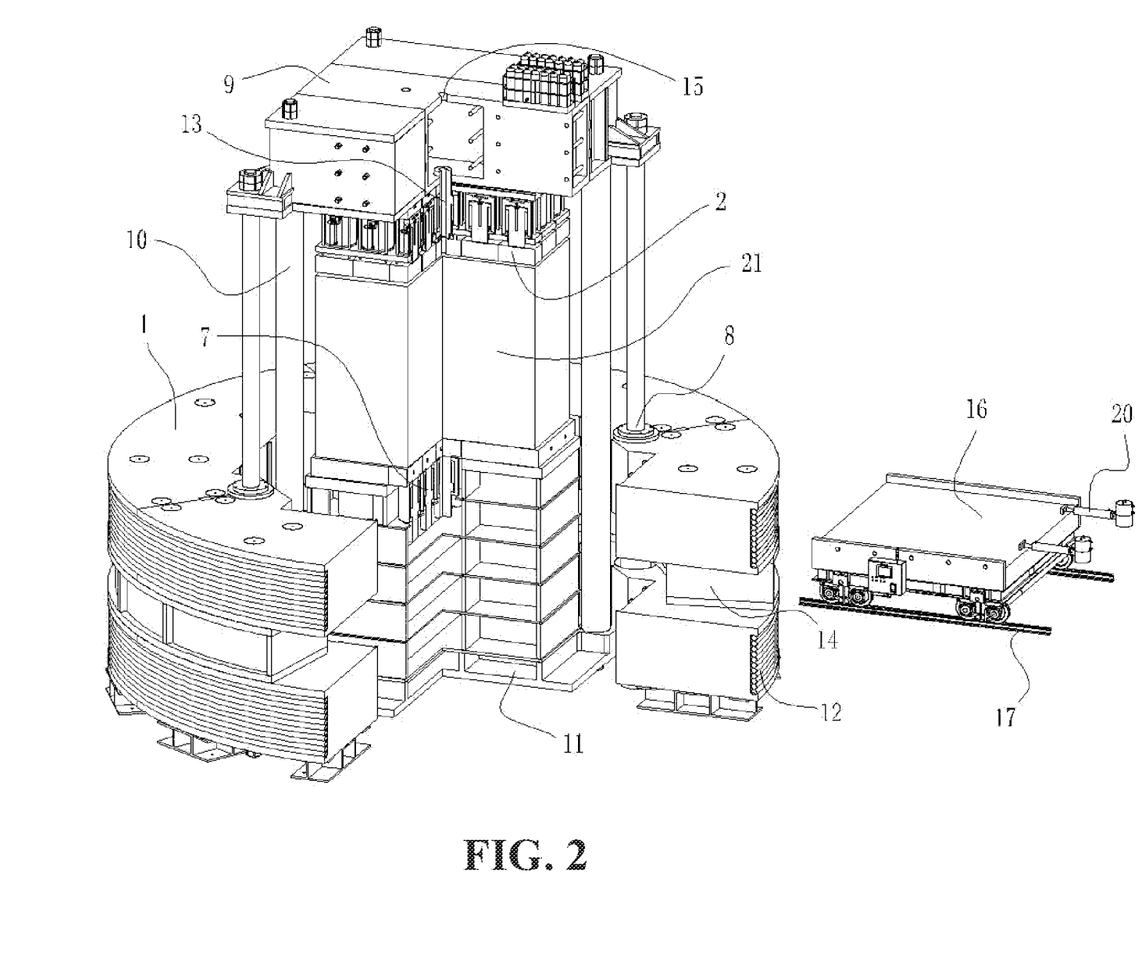
FIG. 2 is the schematic view of the three-dimensional loading structure (the second to fourth array distributed hydraulic actuator groups are not shown) of the ultra-large physical simulation facility for deep engineering disasters of the invention (state II).
Figure 3:
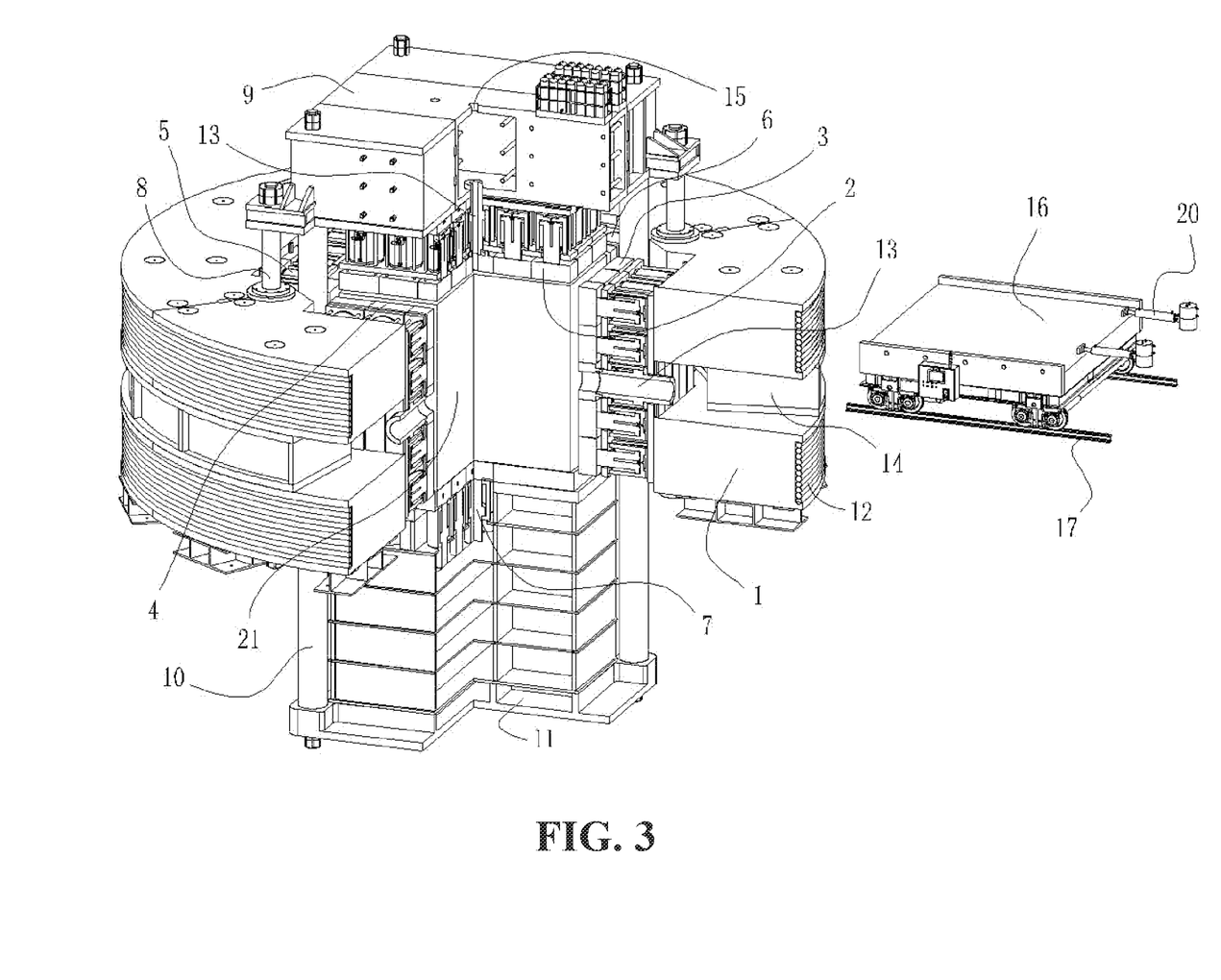
FIG. 3 is a schematic view of the three-dimensional loading structure of the ultra-large physical simulation facility for deep engineering disasters of the invention (state III).

The ultra-long stroke lifting and locking hydraulic cylinders 8 are controlled to perform a retraction action, so that under the driving of the ultra-long stroke lifting and locking hydraulic cylinders 8, the vertical ultra-large reaction frame moves downward as a whole, until the vertical ultra-large physical model sample in the ultra-large reaction frame accurately enters the horizontal ultra-large reaction frame 1.

Step IV: Pre-Clamping the Ultra-Large Physical Model Sample.

A displacement control manner is adopted, firstly, the second array distributed hydraulic actuator group 3 and the fourth array distributed hydraulic actuator group 5 pre-clamp the ultra-large physical model sample 21, and then the third array distributed hydraulic actuator group 4 and the fifth array distributed hydraulic actuator group 6 pre-clamp the ultra-large physical model sample 21.

Step V: Performing a Pre-Stress Loading.

A load control manner is adopted, firstly, the second array distributed hydraulic actuator group 3 and the fourth array distributed hydraulic actuator group 5 perform a pre-stress loading on the ultra-large physical model sample 21, and the pre-stress is loaded to 0.01 MPa; the third array distributed hydraulic actuator group 4 and the fifth array distributed hydraulic actuator group 6 perform a pre-stress loading on the ultra-large physical model sample 21, and the pre-stress is loaded to 0.01 MPa; then, the displacement control manner is adopted, the first array distributed hydraulic actuator group 2 pre-compresses the ultra-large physical model sample 21, and then the manner is changed into the load control manner, the first array distributed hydraulic actuator group 2 performs a pre-stress loading on the ultra-large physical model sample 21, and the pre-stress is loaded to 0.01 MPa, wherein, a load control rate during pre-stress loading is 2 kN/s.

Step VI: Performing a Primary Stress Loading.

The load control manner is adopted, firstly, the third array distributed hydraulic actuator group 4 and the fifth array distributed hydraulic actuator group 6 perform a primary stress loading on the ultra-large physical model sample 21, and the primary stress is loaded to 1 MPa; the second array distributed hydraulic actuator group 3 and the fourth array distributed hydraulic actuator group 5 perform a primary stress loading on the ultra-large physical model sample 21, and the primary stress is loaded to 2 MPa; then, the first array distributed hydraulic actuator group 2 performs a primary stress loading on the ultra-large physical model sample 21, and the primary stress is loaded to 5 MPa, wherein the load control rate during the primary stress loading is 2 kN/s; at the same time, in a process of performing the primary stress loading, data is monitored synchronously by the magnetostrictive displacement sensor, the load sensor, the stress-strain-vibration-acoustic emission-ultrasonic integrated sensor, the fiber grating high-sensitivity fine temperature-pressure-stress integrated monitoring sensor and the acoustic emission sensor, wherein during the primary stress loading process, the vertical floating position of the vertical ultra-large reaction frame is dynamically adjusted by the ultra-long stroke lifting and locking hydraulic cylinders 8 to ensure that a geometric center of the ultra-large physical model sample 21 remains unchanged.

Step VII: Performing a Robot Excavation.

A robot excavation and monitoring system is used to excavate a central channel of the through-type hydraulic actuator 13 at the center of the second array distributed hydraulic actuator group 3, wherein a diameter of an excavation hole is 0.5 m, and a depth of the excavation hole is 4 m.

Step VIII: Performing a Stress Load Holding.

After excavation, the ultra-large physical model sample 21 is subjected to a stress load holding for 5000 h, and at this stage, the fracture rockbursts with a small strength can occur.

Step IX: Performing a Tectonic Stress Simulation.

When the ultra-large physical model sample 21 completes 5000 h of the stress load holding, a load control manner is adopted to increase the primary stress loaded by upper two rows of single actuators of the second array distributed hydraulic actuator group 3 and the fourth array distributed hydraulic actuator group 5, and the loaded primary stress is increased to 4 MPa, which is used to form a local high stress at the structural plane of the physical model sample and induce the fracture rockbursts with a large strength, wherein the load control rate during the stress loading is 2 kN/s; at the same time, in the process of loading, a fracture situation of the excavation hole is observed, data is monitored synchronously by the magnetostrictive displacement sensor, the load sensor, the stress-strain-vibration-acoustic emission-ultrasonic integrated sensor, the fiber grating high-sensitivity fine temperature-pressure-stress integrated monitoring sensor and the acoustic emission sensor.

Step X: Performing a Dynamic Disturbance Stress Loading.

The linear distributed hydraulic actuator group 7 is used to perform a local dynamic disturbance on the ultra-large physical model sample 21 on a basis of static stress, an application frequency is 5 Hz, an amplitude is 1 MPa, a disturbance load time is 30 minutes, the fracture rockbursts with a large strength are induced; at the same time, in a process of the local dynamic disturbance, the fracture situation of the excavation hole is observed, data is monitored synchronously by the magnetostrictive displacement sensor, the load sensor, the stress-strain-vibration-acoustic emission-ultrasonic integrated sensor, the fiber grating high-sensitivity fine temperature-pressure-stress integrated monitoring sensor and the acoustic emission sensor.

Step XI: Performing an Unloading.

The displacement control manner is adopted, firstly, the linear distributed hydraulic actuator group 7 is unloaded to 0 MPa, then the first array distributed hydraulic actuator group 2 is unloaded to 4 MPa, then the first array distributed hydraulic actuator group 2 and the second array distributed hydraulic actuator group 3 and the upper two rows of the single actuators of the fourth array distributed hydraulic actuator group 5 are simultaneously unloaded to 2 MPa, then the first array distributed hydraulic actuator group 2, the second array distributed hydraulic actuator group 3 and the fourth array distributed hydraulic actuator group 5 are simultaneously unloaded to 1 MPa, and finally, the first array distributed hydraulic actuator group 2, the second array distributed hydraulic actuator group 3, the third array distributed hydraulic actuator group 4, the fourth array distributed hydraulic actuator group 5 and the fifth array distributed hydraulic actuator group 6 are synchronously unloaded to 0 MPa, wherein the displacement control rate is 10 mm/min.

Step XII: Performing a Sample Disassembly.

The leads of the stress-strain-vibration-acoustic emission-ultrasonic integrated sensor, the fiber grating high-sensitivity fine temperature-pressure-stress integrated monitoring sensor and the acoustic emission sensor are disconnected with the distributed main control center, then the ultra-long stroke lifting and locking hydraulic cylinders 8 are controlled to perform an extension action, so that under the driving of the ultra-long stroke lifting and locking hydraulic cylinder 8, the vertical ultra-large reaction frame moves upward as a whole, until the vertical ultra-large physical model sample 21 in the ultra-large reaction frame accurately is completely removed from the horizontal ultra-large reaction frame 1; when the ultra-large physical model sample 21 is fully raised, the sample bearing sliding table 18 is lifted by the sliding table lifting oil cylinders to the predetermined height, so that the sample bearing sliding table 18 is out of contact with the upper surface of the reaction base 11, then the sliding table guide rails 19 penetrate through a gap between the sample bearing siding table 18 and the upper surface of the reaction base 11, the other ends of the sliding table guide rails 19 need to be accurately lapped on the upper surface of the RGV rail flat car 16, then the piston rods of the sliding table lifting oil cylinders are controlled to retract to the initial position until the sliding table lifting oil cylinders are hidden back into the grooves, and at this time, the sample bearing sliding table 18 also falls onto the sliding table guide rails 19; after the sample bearing sliding table 18 completely falls onto the sliding table guide rails 19, the siding table push and pull devices 20 and the sample bearing sliding table 18 are connected together again, and then a pulling force is applied to the sample bearing sliding table 18 through the sliding table push and pull devices 20, so that the sample bearing sliding table 18 moves directly above the RGV rail flat car 16 along the sliding table guide rails 19; and when the sample bearing sliding table 18 moves in place, the sliding table push and pull devices 20 are disconnected with the sample bearing sliding table 18, then the sample bearing sliding table 18 is lifted again by the sliding table lifting oil cylinders to make the sample bearing sliding table 18 out of contact with the sliding table guide rails 19, then the sliding table guide rails 19 are removed, finally, the sliding table lifting oil cylinders are controlled to retract and hide into the grooves, finally, the sample bearing sliding table 18 falls onto the upper surface of the RGV rail flat car 16, and at this time, sample removal of the ultra-large physical model sample 21 is completed.

The scheme in the embodiments is not intended to limit the scope of patent protection of the invention. Any equivalent implementation or change that does not deviate from the invention is included in the scope of the patent of the case.

What is claimed is:

1. A three-dimensional loading structure of an ultra-large physical simulation facility for deep engineering disasters, comprising a horizontal ultra-large reaction frame, a vertical ultra-large reaction frame, a first array distributed hydraulic actuator group, a second array distributed hydraulic actuator group, a third array distributed hydraulic actuator group, a fourth array distributed hydraulic actuator group, a fifth array distributed hydraulic actuator group, a linear distributed hydraulic actuator group and ultra-long stroke lifting and locking hydraulic cylinders, wherein the vertical ultra-large reaction frame comprises a reaction top plate, support columns and a reaction base; the horizontal ultra-large reaction frame adopts a circular structure being circular in an outer part and square in an inner part; the horizontal ultra-large reaction frame is fixedly mounted in a large concrete foundation pit mounting slot, and an upper surface of the horizontal ultra-large reaction frame is flush with a ground; the vertical ultra-large reaction frame is located inside the horizontal ultra-large reaction frame; the reaction base is located directly below the reaction top plate, and the reaction base and the reaction top plate are fixedly connected by the four uniformly-distributed support columns; the support columns adopt a hollow structure, a pre-stressed pull rod is mounted in each support column in a penetrating manner, and the reaction top plate, the support columns and the reaction base are firmly connected by the pre-stressed pull rods and through pre-stress forces provided by high-strength nuts; the four ultra-long stroke lifting and locking hydraulic cylinders are uniformly arranged between the horizontal ultra-large reaction frame and the reaction top plate; a cylinder barrel of each ultra-long stroke lifting and locking hydraulic cylinder is embedded and fixed in the horizontal ultra-large reaction frame, and a piston rod of each ultra-long stroke lifting and locking hydraulic cylinder is upwards to be fixedly connected with the reaction top plate; the first array distributed hydraulic actuator group is arranged on a lower surface of the reaction top plate; the second array distributed hydraulic actuator group, the third array distributed hydraulic actuator group, the fourth array distributed hydraulic actuator group and the fifth array distributed hydraulic actuator group are respectively arranged on an inner square surface of the horizontal ultra-large reaction frame, the second array distributed hydraulic actuator group and the fourth array distributed hydraulic actuator group are distributed in opposite directions, and the third array distributed hydraulic actuator group and the fifth array distributed hydraulic actuator group are distributed in opposite directions; and the linear distributed hydraulic actuator group is embedded at a middle of an upper surface of the reaction base, and a loading surface of the linear distributed hydraulic actuator group is flush with the upper surface of the reaction base.

2. The three-dimensional loading structure according to claim 1, wherein the horizontal ultra-large reaction frame is formed by splicing eight segments of arch beams, an outer circumference surface of the horizontal ultra-large reaction frame is wrapped with prestressed carbon fibers, and a winding preload of the prestressed carbon fibers is not less than 1.5 times of a working load of the horizontal ultra-large reaction frame.

3. The three-dimensional loading structure according to claim 2, wherein single hydraulic actuators at centers of the first array distributed hydraulic actuator group, the second array distributed hydraulic actuator group, the third array distributed hydraulic actuator group, the fourth array distributed hydraulic actuator group and the fifth array distributed hydraulic actuator group all adopt through-type hydraulic actuators, and a piston rod of each through-type hydraulic actuator adopts a double-output rod hollow structure.

4. The three-dimensional loading structure according to claim 3, wherein four excavation channels are uniformly distributed on a circumference of the horizontal ultra-large reaction frame, and the four excavation channels and the through-type hydraulic actuators at the centers of the second array distributed hydraulic actuator group, the third array distributed hydraulic actuator group, the fourth array distributed hydraulic actuator group and the fifth array distributed hydraulic actuator group are coaxially distributed.

5. The three-dimensional loading structure according to claim 4, wherein drilling channels are formed in a center of the reaction top plate, and the drilling channels and the through-type hydraulic actuator at the center of the first array distributed hydraulic actuator group are coaxially distributed.

6. The three-dimensional loading structure according to claim 5, wherein the ultra-long stroke lifting and locking hydraulic cylinders are also used as follow-up centering hydraulic actuators of the vertical ultra-large reaction frame; a friction-reducing sliding sleeve is arranged between the support columns and the horizontal ultra-large reaction frame; and each ultra-long stroke lifting and locking hydraulic cylinder is provided with an energy accumulator and an electronic pressure valve, and the electronic pressure valves are used to dynamically adjust a pressure in the energy accumulators, so that the pressure in the energy accumulators and a self-gravity of the vertical ultra-large reaction frame always maintain a dynamic balance.

7. The three-dimensional loading structure according to claim 6, wherein a sample transferring mechanism is arranged on a side ground of the large concrete foundation pit mounting slot where the horizontal ultra-large reaction frame is located; the sample transferring mechanism comprises a RGV rail flat car, flat car guide rails, a sample bearing sliding table, sliding table guide rails, sliding table lifting oil cylinders and sliding table push and pull devices; the flat car guide rails are fixedly laid on the ground, the RGV rail flat car is arranged on the flat car guide rails, and an upper surface of the RGV rail flat car is flush with the upper surface of the horizontal ultra-large reaction frame; the sample bearing sliding table is placed on the upper surface of the RGV rail flat car, four grooves are uniformly formed in a lower surface of the sample bearing sliding table, one sliding table lifting oil cylinder is vertically mounted in each groove, and when piston rods of the sliding table lifting oil cylinders are fully retracted, the sliding table lifting oil cylinders are completely hidden in the grooves; the sliding table guide rails adopt a temporary laying structure, and when the sliding table guide rails are temporarily laid between the upper surface of the RGV rail flat car and the upper surface of the horizontal ultra-large reaction frame, the sample bearing sliding table is used in conjunction with the sliding table guide rails; and the sliding table push and pull devices are arranged between the sample bearing sliding table and the ground.

8. The three-dimensional loading structure according to claim 7, wherein all single hydraulic actuators contained in the linear distributed hydraulic actuator group are dynamic hydraulic actuators, and a maximum disturbance frequency of each dynamic hydraulic actuator is 5 Hz; an external bracket of each dynamic hydraulic actuator comprises four guide rods resisting lateral forces; and each dynamic hydraulic actuator adopts a double-output rod symmetrical structure, a large-flow integrated valve block is arranged outside a cylinder barrel of each dynamic hydraulic actuator, and each large-flow integrated valve block is provided with double servo valves.

9. The three-dimensional loading structure according to claim 8, wherein structures of the single hydraulic actuators contained in the first array distributed hydraulic actuator group, the second array distributed hydraulic actuator group, the third array distributed hydraulic actuator group, the fourth array distributed hydraulic actuator group and the fifth array distributed hydraulic actuator group are the same, a magnetostrictive displacement sensor is arranged between a piston inside a cylinder barrel and a bottom plate of the cylinder barrel of each single hydraulic actuator, a servo valve and an energy accumulator are arranged outside the cylinder barrel of each single hydraulic actuator, and a load sensor is arranged at a piston end of each single hydraulic actuator.

10. The three-dimensional loading structure according to claim 9, wherein a cluster large-flow high-pressure hydraulic pump station is arranged under the side ground of the large concrete foundation pit mounting slot where the horizontal ultra-large reaction frame is located, a hydraulic oil source system is arranged in the cluster large-flow high-pressure hydraulic pump station, adopts a distributed hydraulic station design scheme, and comprises eight hydraulic stations in total, wherein first five hydraulic stations are respectively connected with the first array distributed hydraulic actuator group, the second array distributed hydraulic actuator group, the third array distributed hydraulic actuator group, the fourth array distributed hydraulic actuator group and the fifth array distributed hydraulic actuator group, a sixth hydraulic station is connected with the linear distributed hydraulic actuator group, a seventh hydraulic station is connected with the ultra-long stroke lifting and locking hydraulic cylinders, and an eighth hydraulic station serves as a standby hydraulic station.

\* \* \* \* \*